(12) United States Patent
Lu et al.

(10) Patent No.: US 7,659,546 B2
(45) Date of Patent: Feb. 9, 2010

(54) LIGHT EMITTING DEVICE

(75) Inventors: Ming Lu, Sijhih (TW); Geoffrey Wen Tai Shuy, New Territories (CN)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 11 days.

(21) Appl. No.: 11/317,281

(22) Filed: Dec. 23, 2005

(65) Prior Publication Data
US 2007/0145389 A1 Jun. 28, 2007

(51) Int. Cl.
H01L 29/22 (2006.01)
H01L 27/15 (2006.01)

(52) U.S. Cl. .............................. 257/94; 257/90; 257/89; 257/85; 257/84; 257/96; 257/81; 257/99; 257/100; 315/169.3

(58) Field of Classification Search .................. 257/85, 257/88, 94, 96, 97, 79, 90, 89, 84, 99, 81, 257/100; 313/498–500; 315/169.3
See application file for complete search history.

(56) References Cited

U.S. PATENT DOCUMENTS

| | | | |
|---|---|---|---|
| 4,271,408 A * | 6/1981 | Teshima et al. | 345/83 |
| 4,887,074 A | 12/1989 | Simon et al. | |
| 6,307,218 B1 | 10/2001 | Steigerwald | |
| 6,445,007 B1 * | 9/2002 | Wu et al. | 257/80 |
| 6,563,139 B2 * | 5/2003 | Hen | 257/89 |
| 6,963,085 B2 | 11/2005 | Chou | |
| 7,005,680 B2 | 2/2006 | Otsuka | |
| 7,087,985 B2 | 8/2006 | Park | |
| 7,106,010 B2 | 9/2006 | Liao et al. | |

(Continued)

FOREIGN PATENT DOCUMENTS

CN 1630110 6/2005

(Continued)

OTHER PUBLICATIONS

Craford, M. George, Holonyak, Nick, and Kish, Frederiek, "In Pursuit of the Ultimate Lamp"; Scientific American 284, 62, Feb. 2001.

(Continued)

Primary Examiner—Kenneth A Parker
Assistant Examiner—Joseph Nguyen
(74) Attorney, Agent, or Firm—Schlee IP International, P.C.; Alexander R. Schlee

(57) ABSTRACT

A light emitting device firstly includes a light emitting diode (LED) structure, having a top surface with a light emitting region. The device also has a heterojunction within the device structure, the heterojunction having a p-type and an n-type semiconductor layer, and a plurality of electrodes positioned on the top surface, each being electrically connected to one of the p-type and n-type semiconductor layers. At least a first and a second electrodes are connected to a same type semiconductor layer and are physically separated from each other. The device further includes a first and a second heterojunction regions within the heterojunction, each being respectively defined between one of the first and second electrodes and one of the other electrodes connected to the other type semiconductor layer. The first and second heterojunction regions are alternatively driven for emitting lights in the time domain.

8 Claims, 4 Drawing Sheets

U.S. PATENT DOCUMENTS

| | | | |
|---|---|---|---|
| 7,180,487 | B2 | 2/2007 | Kamikawa et al. |
| 7,230,222 | B2 | 6/2007 | Cheng et al. |
| 7,293,907 | B2 | 11/2007 | Kim et al. |
| 7,385,653 | B2 | 6/2008 | Kim et al. |
| 2004/0065893 | A1* | 4/2004 | Otsuka et al. ............ 257/99 |
| 2005/0133807 | A1 | 6/2005 | Park |
| 2006/0256826 | A1* | 11/2006 | Lin et al. ............ 372/43.01 |

FOREIGN PATENT DOCUMENTS

| | | | |
|---|---|---|---|
| DE | 19953160 | | 5/2000 |
| GB | 2343994 | | 5/2000 |
| JP | 55123182 | * | 3/1979 |
| JP | 55029178 | | 3/1980 |
| JP | 2000164930 | | 6/2000 |
| JP | 2005183910 | | 7/2005 |
| KR | 10-20050061743 | | 6/2005 |

OTHER PUBLICATIONS

Office Action issued by the United States Patent and Trademark Office for U.S. Appl. No. 11/317,937 dated Jun. 26, 2008.

Office Action issued by the United States Patent and Trademark Office for U.S. Appl. No. 11/318,314 dated Feb. 21, 2008.

Notice of Allowance issued by the United States Patent and Trademark Office for U.S. Appl. No. 11/318,314 dated Sep. 16, 2008.

* cited by examiner

LIGHT EMITTING DEVICE

FIELD OF THE INVENTION

The present application relates to semiconductor light emitting diodes.

BACKGROUND OF THE INVENTION

Various improvements have been proposed to enhance the performance of semiconductor light emitting diodes (LED). For example, U.S. Pat. No. 6,307,218, entitled "Electrode structures for light emitting device" and assigned to LumiLeds Lighting, U.S., LLC, discloses finger type electrode layouts to solve the current crowding issue in semiconductor LEDs.

Nevertheless, further improvements may still be desirable. For example, few conventional designs have considered heat dissipation and/or energy consumption issues. Such issues may become more noticeable if the LEDs have a relatively large size.

In addition, in order to achieve good current spreading in the semiconductor layers and to avoid overheating in partial areas caused by possible relatively high current in such areas, the design of the '218 patent may need to have a relatively compact electrode layout design. As a result, the opening area for light emission may be unnecessarily small, which may not be desirable, either.

OBJECT OF THE INVENTION

It is an object of the present invention to provide a light emitting device with improved heat dissipation or energy consumption characters, or at least provide the public with a useful choice.

SUMMARY OF THE INVENTION

According to an aspect of the present invention, a light emitting device firstly includes a light emitting diode (LED) structure, having a top surface with a light emitting region. The device also has a heterojunction within the LED structure, the heterojunction having a p-type and an n-type semiconductor layer, and a plurality of electrodes positioned on the top surface, each being electrically connected to one of the p-type and n-type semiconductor layers. At least a first and a second electrodes are connected to a same type semiconductor layer and are physically separated from each other. The device further includes a first and a second heterojunction regions within the heterojunction, each being respectively defined between one of the first and second electrodes and one of the other electrodes connected to the other type semiconductor layer. The first and second heterojunction regions are alternatively driven for emitting lights in the time domain.

An embodiment having a power source in electrical connection with the first and second electrodes for alternately driving the first and second heterojunction regions.

Another embodiment where the power source repeatedly, sequentially, and alternately drives the first and second heterojunction regions.

Another embodiment where the power source is an alternate current power source.

Another embodiment having a rectifying circuit electrically connected between the power source and at least one of the first and second electrodes.

Another embodiment where the power source outputs a plurality of periodic discontinuous pulses for alternately driving the first and second heterojunction regions.

Another embodiment where the output of the power source drives at least one of the first and second heterojunction regions at a frequency of at least 20 Hz.

Another embodiment in which the first and second electrodes are diametrically opposed.

Another embodiment in which the first and second electrodes are located at the corners of the top surface.

Another embodiment having a transparent or semi-transparent electrode layer forming the top surface, assisting in the current spreading. The transparent or semi-transparent electrode layer can be made of a material selected from a group of Indium Tin Oxide, Indium Zinc Oxide, and Zinc Oxide.

According to another aspect of the present invention, a light emitting device includes
- a light emitting diode structure having a top surface with a light emitting region;
- a heterojunction within the light emitting diode structure, the heterojunction including a p-type and an n-type semiconductor layer;
- at least a first electrode and a second electrode positioned physically separately on the top surface, each electrode being electrically connected to the same p-type and n-type semiconductor layers;
- a ground electrode; and
- a first heterojunction region within the heterojunction between the first electrode and the ground electrode, and a second heterojunction region within the heterojunction between the second electrode and the ground electrode, wherein the first heterojunction region and the second heterojunction region are alternately driven for emitting light in the time domain.

Other aspects and advantages of the invention will become apparent from the following detailed description, taken in conjunction with the accompanying drawings, which description illustrates by way of example the principles of the invention.

DETAILED DESCRIPTION

Figure 1:
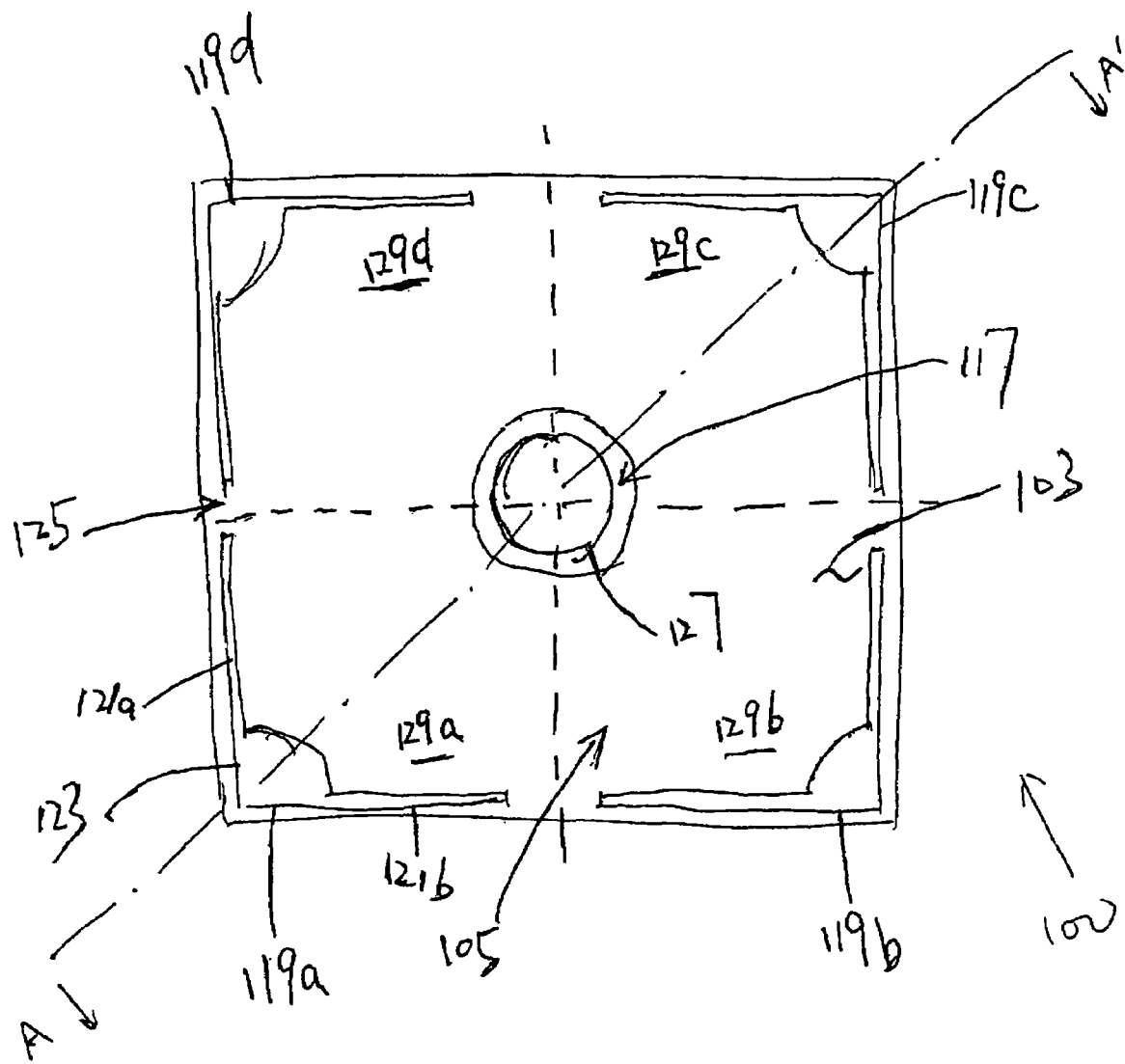
FIG. 1 is a top plan view of an exemplary light emitting device according to an embodiment of the present invention.
Figure 2:
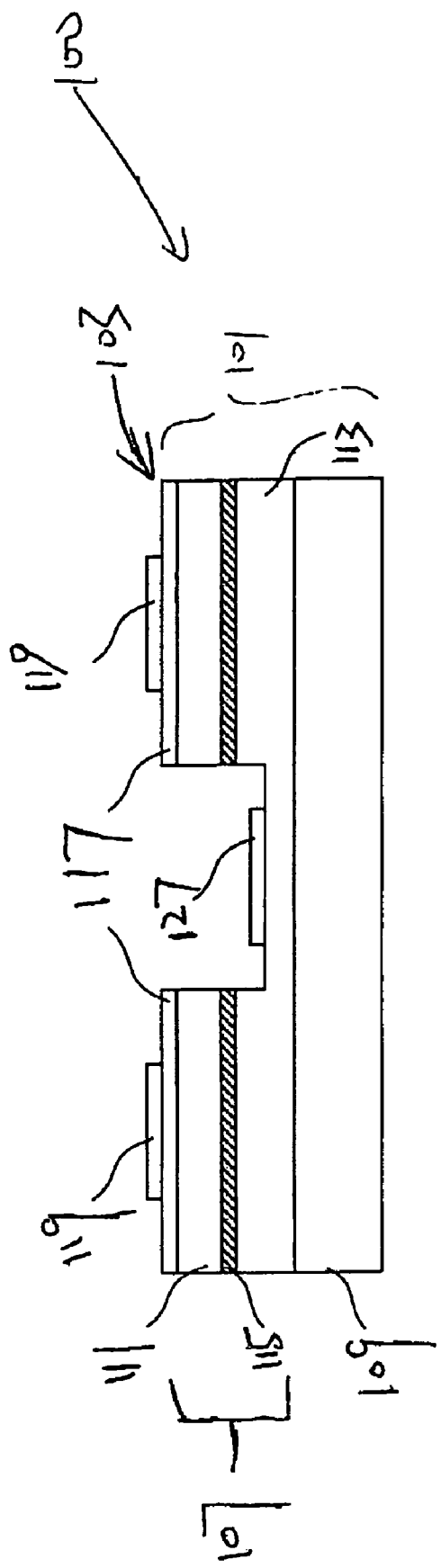
FIG. 2 is a cross section view of the light emitting device of FIG. 1 along line A-A'.

As shown in FIGS. 1 and 2, an exemplary light emitting embodiment 100 of the present invention firstly includes a light emitting diode (LED) structure 101, having a top surface 103 in a generally square shape in the exemplary embodiment with a light emitting region 105. The LED 101 includes an active region 107 on an optional substrate 109. The active region 107, e.g. a heterojunction, has a p-type and an n-type semiconductor layer 111, 113, which form an active layer 115, i.e., a p-n injection, between the p- and n-type semiconductor layers 111, 113.

A transparent electrode layer 117, made of materials selected from a group of, e.g., Indium Tin Oxide, Indium Zinc Oxide, or Zinc Oxide, is attached atop the p-type semiconductor layer 111 such that it defines the top surface of the LED. The transparent electrode layer 117 functions as a current spreading layer and a transparency electrode as could be generally understood in the art. Due to its transparency, lights can be emitted from the top surface of the LED. Thereby, the light emitting region 105 is defined by uncovered regions of the transparent electrode layer 117.

Four p-electrodes 119a-d are attached to the transparent electrode layer 117 at its four corners and are electrically connected thereto for providing stable electrical contacts between the transparent electrode layer and external electrical contacts. Each p-electrode 119a-d has a pair of thin metal lines 121a, 121b extending from a metal pad or bump 123 at one of the corners substantially perpendicular to each other towards the other two adjacent corners. The pad 123 has a sector shape in the exemplary embodiment and a substantially enlarged size as compared to the finger-type lines 121a, 121b for ensuring good electrical connections to external electrical circuits (not shown in FIGS. 1 and 2). A gap 125 is created between every two adjacent p-electrodes such that the p-electrodes 119a-d are physically separated from each other.

Part of the active region 107 and the transparent electrode layer 117 are etched away to expose part of the n-type semiconductor layer such that an n-electrode 127, electrically connected to the n-type semiconductor layer 113, can be electrically isolated from the p-electrodes 119a-d, transparent electrode layer 117 and p-type semiconductor layer 111. The etched part has a substantially circular shape and is positioned in the center of the LED structure when viewed from the top as shown in FIG. 1, As could be appreciated in the art, such p and n-electrode layouts may assist overcoming the current crowding effect.

In addition, four heterojunction regions 129a-d within the heterojunction are virtually defined between the respective p-electrodes 119a-d and the n-electrode 127, which will be discussed in further details. The heterojunction regions 129a-d are defined such that each heterojunction region 129a-d can be activated so as to emit lights when a certain amount of voltage is applied to the respective p-electrode and n-electrode. As could be appreciated, the dotted lines in FIG. 1 virtually defining the heterojunction regions 129a-d are merely for illustration purpose, and an ordinarily skilled person in the art would understand that the heterojunction regions 129a-d may exhibit a different shape.

Figure 3:
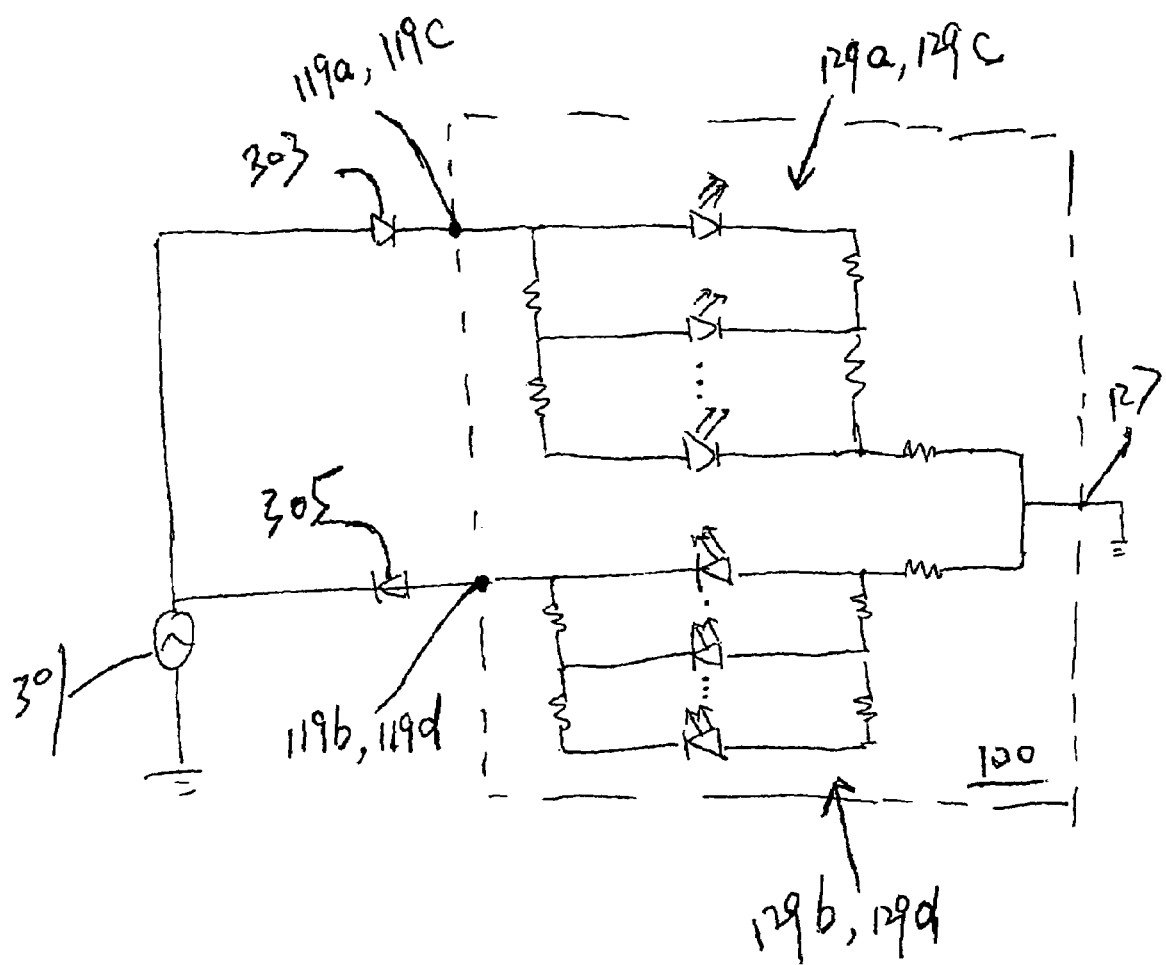
FIG. 3 is a simplified exemplary electrical circuit diagram illustrating the light emitting device of FIGS. 1 and 2 being in use.

As shown in FIG. 3, when in use, p-electrodes 119a and 119c are connected to each other and further to a power source 301 via a rectifying circuit 303 such as a diode. P-electrodes 119b and 119d are also connected to each other and further to the power source 301 via another rectifying circuit 305 such as a diode. N-electrode 127 is connected to ground. Heterojunction regions 129a-d are simplified as a plurality of light emitting diode units connected in parallel and to the electrodes via a plurality of resistors as generally understood in the art.

Figure 4:
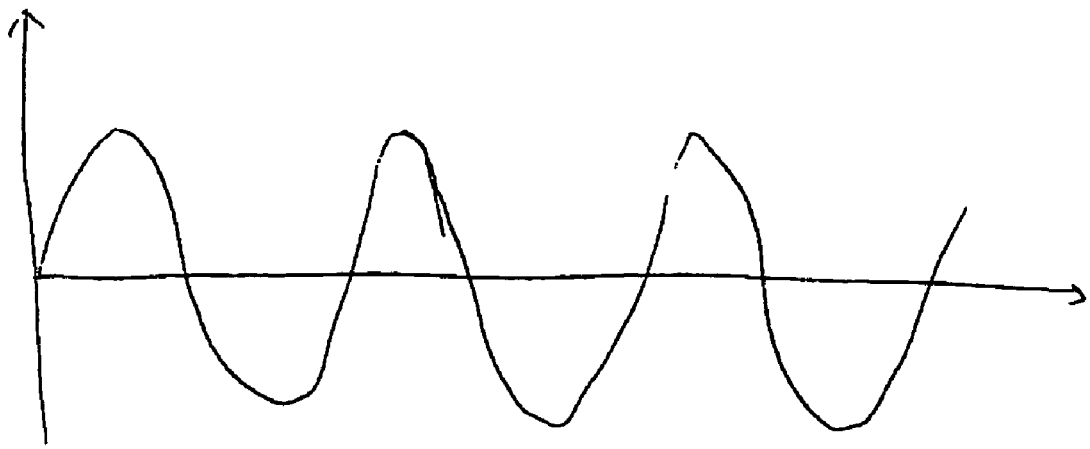
FIG. 4 illustrates the output of a type of power signals suitable for driving the light emitting device of FIGS. 1 and 2.

FIG. 4 illustrates the output of an exemplary type of power source, i.e., an alternating current power source, which is suitable for use in the device of FIG. 3. As could be understood in the art, during the positive phases of the output of the power source, voltage is applied between p-electrodes 119a, 119c and n-electrode 127; while during the negative phases, voltage is applied between p-electrodes 119b, 119d and n-electrode 127. Thereby, heterojunction regions 129a, 129c and 129b, 129d are alternately and at least partially driven to emit lights in the time domain. Due to the persistence of human vision, when the frequency of the AC power signals is sufficiently high, for example, higher than 20 Hz, the discontinuously or variance in the light may becomes unnoticeable in the human vision.

It can be generally understood that activation or driving of the heterojunction regions 129a-d at least partially depends upon the magnitude of the current applied therethrough. For example, when a relatively high current is applied, a relatively large area of each heterojunction regions can be activated to emit lights, and vice versa.

An ordinarily skilled person in the art would appreciate that the above-described embodiments may achieve lower energy consumptions by alternately driving various heterojunction regions of an LED structure in the time domain. Since each heterojunction region of the LED structure now works in an on-and-off status, heat dissipation can be improved as well.

Furthermore, a person skilled in the art would recognize that unnecessary coverage of the transparent electrode layer by the p and n-electrode layout can be reduced as compared to conventional finger-type electrode layout. This is because in the exemplary embodiment of the present invention as shown in FIGS. 1 and 2, the overheating problematic is resolved by alternately driving different heterojunction regions, and therefore the exemplary embodiment of FIGS. 1 and 2 may not need compact electrode layout to achieve even current spreading, as in the conventional prior art designs. As a result, the exemplary embodiment may provide a relatively large light emission area.

Figure 5:
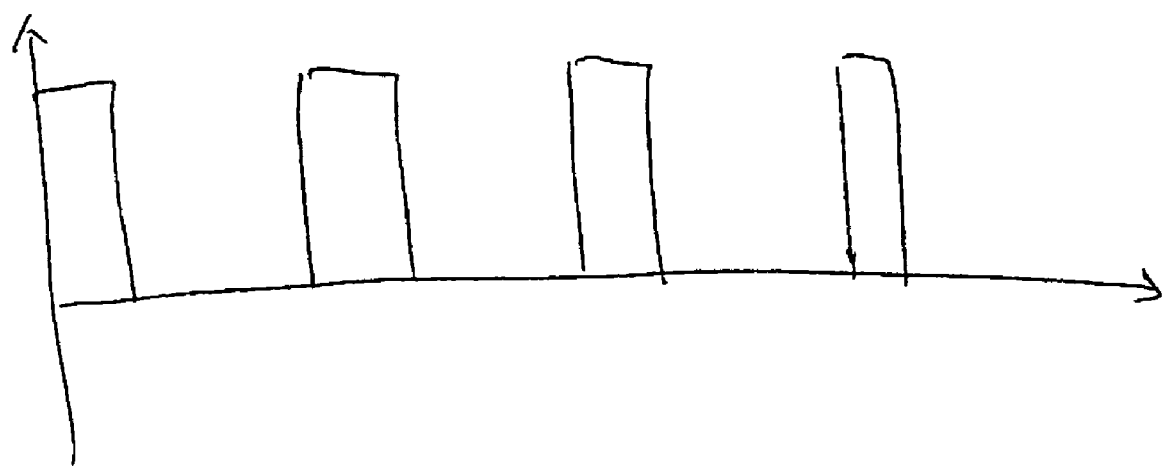
FIG. 5 illustrates another type of power signals suitable for driving the light emitting device of FIGS. 1 and 2.

Various type of power signals can be used. For example, FIG. 5 illustrates a different type of output of the power source useful in the light emitting device of FIGS. 1 and 2, having a plurality of periodic discontinuous pulses to be sequentially and alternately applied to the p-electrodes 129a, 129c and 129b, 129d in the time domain.

Other alternatives can be made to the preceding described exemplary embodiment. For example, the transparent electrode layer, which assists improving current spreading, may not be necessary, especially in non-top-emitting LEDs.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself. The definitions of the words or elements of the following claims are, therefore, defined in this specification to include not only the combination of elements which are literally set forth, but all equivalent structure, material or acts for performing substantially the same function in substantially the same way to obtain substantially the same result.

What is claimed is:

1. A light emitting device, comprising:
   a light emitting diode (LED) structure, including a top surface with a light emitting region;
   a heterojunction within the LED structure, the heterojunction including a p-type and an n-type semiconductor layer;
   a first and second p-electrode positioned on the top surface substantially located on a periphery of the top surface, said p-electrodes each being electrically connected to the p-type semiconductor layer, wherein the first and second p-electrodes are physically separated from each other;

an n-electrode that is positioned in a substantially central location on the top surface and that is electrically connected to the n-type semiconductor layer; wherein
the heterojunction comprises a first heterojunction region and a second heterojunction region, the first heterojunction region being defined between the first p-electrode and the n-electrode and the second heterojunction region being defined between the second p-electrode and the n-electrode, said n-electrode being common grounded;
an alternating current power source that is electrically connected such that the first and second heterojunction regions are powered repeatedly, sequentially and alternately in the time domain.

2. The light emitting device of claim 1, further comprising a rectifying circuit electrically connected between the power source and at least one of the first and second p-electrodes.

3. The light emitting device of claim 1, wherein the power source outputs a plurality of periodic discontinuous pulses for alternately driving the first and second heterojunction regions, respectively.

4. The light emitting device of claim 1, wherein the output of the power source drives at least one of the first and second heterojunction regions at a frequency of at least 20 Hz.

5. The light emitting device of claim 1, wherein the first and second p-electrodes are diametrically opposed.

6. The light emitting device of claim 1, wherein the first and second p-electrodes are located at the corners of the top surface.

7. The light emitting device of claim 1, further comprising a transparent or semi-transparent electrode layer forming the top surface.

8. The light emitting device of claim 7, wherein the electrode layer is made of a material selected from the group consisting of Indium Tin Oxide, Indium Zinc Oxide, and Zinc Oxide.

\* \* \* \* \*

UNITED STATES PATENT AND TRADEMARK OFFICE
CERTIFICATE OF CORRECTION

| | |
|---|---|
| PATENT NO. | : 7,659,546 B2 |
| APPLICATION NO. | : 11/317281 |
| DATED | : February 9, 2010 |
| INVENTOR(S) | : Ming Lu and Geoffrey Wen Tai Shuy |

It is certified that error appears in the above-identified patent and that said Letters Patent is hereby corrected as shown below:

Column 1, Line 13

Reads: structures for light emitting device" and assigned to
Should read: structures for light emitting devices" and assigned to Column 3, line 1

Reads: A transparent electrode layer 117, made of materials
Should read: A transparent electrode layer 119, made of materials Signed and Sealed this Twentieth Day of April, 2010

David J. Kappos
*Director of the United States Patent and Trademark Office*